United States Patent [19]

Alvi et al.

[11] Patent Number: 4,764,481

[45] Date of Patent: Aug. 16, 1988

[54] GROWN SIDE-WALL SILICIDED SOURCE/DRAIN SELF-ALIGN CMOS FABRICATION PROCESS

[75] Inventors: Nadeem S. Alvi; Paul E. Stevenson, both of Kokomo, Ind.

[73] Assignee: Delco Electronics Corporation, Kokomo, Ind.

[21] Appl. No.: 88,238

[22] Filed: Aug. 24, 1987

[51] Int. Cl.$^4$ .......................................... H01L 21/225
[52] U.S. Cl. .......................................... 437/56; 437/41; 437/58; 437/40; 437/200; 437/160; 437/161; 437/162; 437/192; 357/71; 148/DIG. 147
[58] Field of Search .................... 437/34, 40, 56, 41, 437/57, 97, 58, 98, 59, 200, 160, 161, 192, 201, 162, 163, 164; 357/23.1, 42, 71

[56] References Cited

U.S. PATENT DOCUMENTS

| | | | |
|---|---|---|---|
| 4,364,166 | 12/1982 | Crowder et al. | 437/59 |
| 4,450,620 | 5/1984 | Fuls et al. | 437/34 |
| 4,459,740 | 7/1984 | Schwabe et al. | 437/56 |
| 4,555,842 | 12/1985 | Levinstein et al. | 437/56 |
| 4,640,844 | 2/1987 | Neppl et al. | 437/57 |

OTHER PUBLICATIONS

D. J. Tsang, S. Ogura, W. W. Walker, J. F. Shepard, and D. L. Critchlow, "Fabrication of High-Performance LDDFET's with Oxide Sidewall-Spacer Technology", IEEE Trans. Electron Devices, ED-29, pp. 590-596, 1982.

S. Ogura, C. F. Codella, N. Rovedo, J. F. Shepard, and J. Riseman, "A Half Micron MOSFET Using Double Implanted LDD", IEDM Tech. Dig., pp. 718-721, 1982.

S. I. Satoh and H. Abe, "Self-Aligned Graded-Drain Structure for VLSI," Jarect, vol. 13, Semiconductor Technologies, J. Nishizawa, Ed: North Holland, pp. 121-135, 1984.

M-L Chen et al., "A High Performance Submicron CMOS Process with Self-aligned Chan-Stop and Punch-Through Implants (Twin-Tub V)," IEEE IEDM, pp. 256-259.

K. Tsukamoto et al., "Self-Aligned Titanium Silicidation of Submicron MOS Devices by Rapid Lamp Annealing," IEEE IEDM 1984, pp. 130-133.

K. Balasubramanyam et al., "Characterization of As-P Double Diffused Drain Structure," IEEE IEDM, 1984, pp. 782-785.

D. L. Kwong and N. S. Alvi, "A Novel Silicided Shallow Junction Technology for CMOS VLSI," Published in: Material Issues in Silicon Integrated Circuit Processing, M. Wiltmer ed., Materials Research Society, 1986.

D. L. Kwong, D. C. Meyers, and N. S. Alvi, "Simultaneous Formation of Silicide Ohmic Contacts and Shallow $p^{30}$-n Junctions by Ion-Beam Mixing and Rapid Thermal Annealing," IEEE Electron Device Letters, vol. EDL-6, No. 5, pp. 244-246, May 1985.

Primary Examiner—Brian E. Hearn
Assistant Examiner—T. N. Quach
Attorney, Agent, or Firm—Robert J. Wallace

[57] ABSTRACT

A process for forming CMOS devices uses outdiffusion of implanted ions in a patterned refractory silicidable layer to form the source/drain regions of the device. Moreover, the oxidation of the sidewalls of openings formed in the layer serves to isolate the layer from the polysilicon gate electrode which is later formed in the openings in this layer.

8 Claims, 4 Drawing Sheets

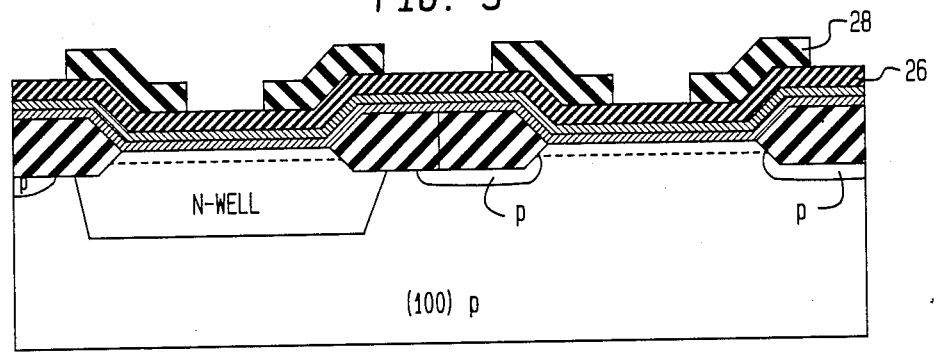
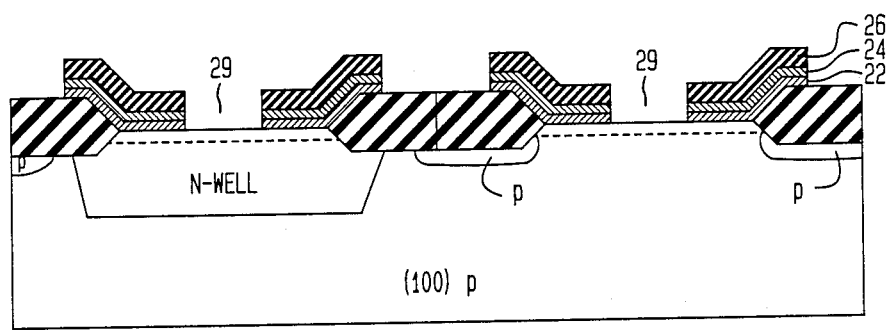

GROWN SIDE-WALL SILICIDED SOURCE/DRAIN SELF-ALIGN CMOS FABRICATION PROCESS

FIELD OF INVENTION

This invention relates to the fabrication of MOS devices.

BACKGROUND OF THE INVENTION

The invention will be described with particular reference to complementary MOS (CMOS) devices, although it is also applicable to either n-type or p-type MOS devices. CMOS devices are proving of great importance for high density integrated circuits because of their special properties, particularly their low current needs. For use in integrated circuits, it is important to minimize the surface area of the chip used by individual CMOS devices. To this end, CMOS devices with self-aligned silicided source/drain regions and with deposited oxide side-wall spacers to separate the channel edges from the source/drain regions have become important since they permit the convenient fabrication of high density arrays of such devices.

Standard silicided source/drain CMOS technology uses side-wall spacers which are formed by a process which basically involves firstly the selective anisotropic etching of a polycrystalline silicon layer to define gate regions with vertical side walls, next the conformal deposition of an oxide layer, and finally the selective anisotropic etching of the oxide layer. This results in a relatively complex process and process complexity usually results in reduced manufacturing yields.

The present invention is a simpler process which should result in increased process yields.

SUMMARY OF THE INVENTION

In particular, the present invention is a semiconductor fabrication process which includes the early formation of a layer of refractory metal that forms a silicide of high conductivity for use as the source and drain electrodes and the conversion of portions of this layer to form an oxide of high resistivity useful as side-wall spacers.

This refractory metal layer is blanket-deposited over the wafer and then portions of it are implanted selectively with ions which will later be diffused out for forming source and drain zones in the wafer. This layer is then patterned to remove the layer from the gate regions of the wafer, leaving vertical side walls in the pattern openings. Thereafter, these vertical side walls are oxidized to form oxide spacers on such side walls for defining the separation between the source and drain zones formed by the outdiffusion of the implanted ions and the gate region defined by the pre-oxidation width of the opening earlier formed on the refractory metal layer.

Beside the advantage of simplicity, the process provides several other advantages. In particular, it inherently results at each channel edge of an impurity profile that suppresses hot carrier or short channel effects. It also permits the source/drain contacts to be made quite close to the channel edges, thereby reducing the source and drain resistances. Finally by forming the silicided source/drain before the side wall spacers, there is avoided potential silicide growth along the spacers which might give rise to source/drain shorts.

The invention will be better understood from the following detailed description of an illustrative embodiment of the invention taken in conjunction with the accompanying drawings.

BRIEF DESCRIPTION OF THE DRAWING

Each of FIGS. 1 through 7 shows in cross section a portion of a silicon wafer in successive stages of the fabrication therefrom of a CMOS device in accordance with an illustrative embodiment of the invention.

It is to be noted that the drawings are not to scale since the vertical dimensions are generally much smaller than the horizontal dimensions.

DETAILED DESCRIPTION OF THE INVENTION

Figure 1:
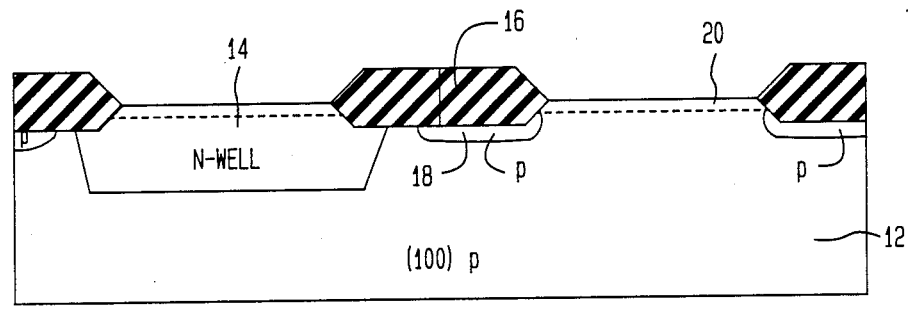

The illustrative embodiment being disclosed as exemplary begins by forming a known starting structure shown in FIG. 1, including the monocrystalline silicon wafer 12, typically high-resistivity p-type, cut along the <100> plane, and including n-type wells 14. In the interest of simplicity, there is shown simply the formation of a single CMOS device in the wafer, although normally many hundreds will be formed simultaneously. The n-type well 14 is isolated along the surface by the thick field oxide regions 16, under a portion of which extends the p-type channel stop 18. A threshold implant layer 20 lies over the surface not covered by the field oxide regions 16.

Various techniques are available for forming the structure depicted. Typically, one begins with p-type monocrystalline silicon of appropriate resistivity, for example 10 ohm-cm, cut along the <100> crystal plane. Next there is formed a composite masking layer by first thermally growing an oxide layer and then depositing by chemical vapor deposition a silicon nitride layer over the oxide layer. The masking layer is then patterned by photolithography to expose portions of the silicon surface. Then acceptor ions are selectively implanted where it is desired to form the channel stop regions 18, and donor ions are selectively implanted where it is desired to form the n-type wells 14. Then the wafer is heated in an oxidizing atmosphere to grow the thick field oxide regions 16. Next, the composite masking layer is removed and there follows a non-selective threshold control implant into the exposed surface, except where masked by the thick field oxide regions, which typically will be of acceptor ions to form the threshold control surface layer 20.

Figure 2:
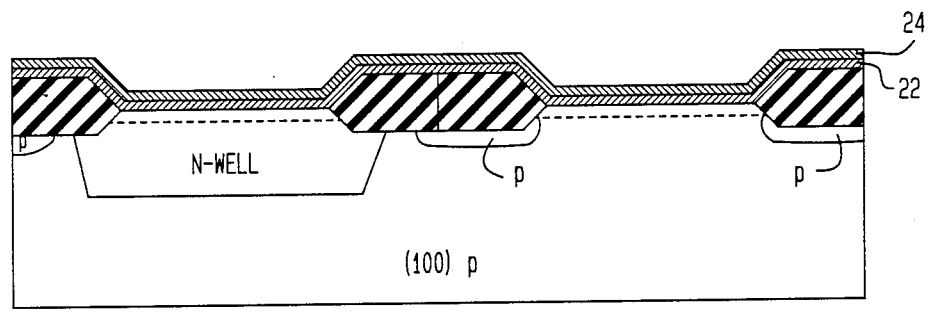

After the structure shown in FIG. 1 has been prepared, a refractory metal that will form a conductive silicide with silicon, such as titanium, is blanket deposited to form a thin metal layer, for example, 50 Angstroms thick over the surface. This is then followed by a blanket deposit of a thicker silicide layer, for example 500 Angstroms of titanium silicide to result in the structure shown in FIG. 2 including titanium layer 22 and titanium silicide layer 24.

Next there is masked the p-type surface regions, typically by blanket deposit of a photoresist that is later patterned photolithograpically, and then donor ions are implanted into portions of the silicide layer 24 overlying the n-type well. The implantation conditions are chosen to insure that the implanted ions, typically either phosphorus or arsenic, are largely captured in the silicide layer, with insignificant penetration into the silicon. The titanium metal layer helps serve as a barrier to this end.

After stripping the photoresist, there is similarly masked the n-type well regions, and then acceptor ions, typically boron, are implanted selectively into the silicide layer portions overlaying the p-type surface regions.

It is feasible to reverse the order of the two implantations, first implanting the p-type regions and then implanting the n-type regions.

Next, there is blanket deposited, typically by chemical vapor deposition, a silicon oxide layer about 2000 Angstroms thick, over the entire front surface of the wafer and this in turn is then covered with a layer of photoresist. The latter is then patterned photolithographically to expose the oxide layer both where the gate region is to be formed and additionally over a central portion of the field oxide region. This is shown in FIG. 3 where the blanket silicon oxide layer 26 is partially covered by the patterned photoresist layer 28 as described. In particular, the photoresist layer 28 advantageously extends a distance, typically about two microns, over each of the field oxide edges.

The patterned photoresist is then used as a mask while the oxide layer 26, the titanium silicide layer 24 and the titanium layer 22 are etched in turn anisotropically to form openings with substantially vertical side walls in each. The remainder of photoresist layer 28 is then stripped away, leaving the structure shown in FIG. 4 in which the original silicon wafer is exposed only at the openings 29 where the gates are to be formed over the n-well and p-type surface.

Figure 5:
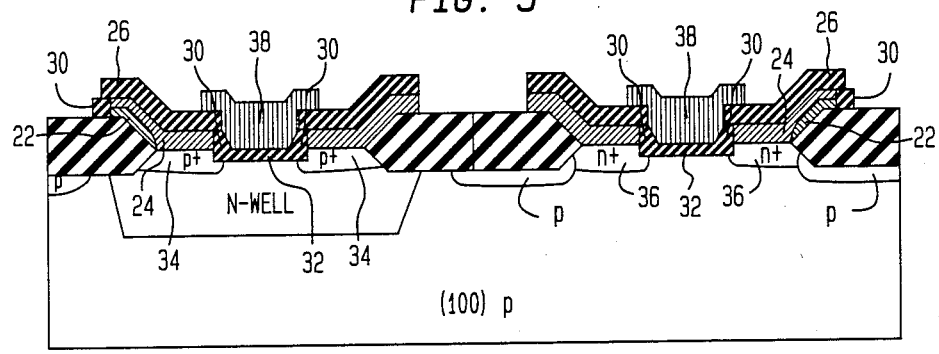

Then the structure is heated to a suitably high temperature in an oxidizing atmosphere to form the gate oxide to a desired thickness, for example 300 Angstroms thick, selectively at the regions exposed. The heating additionally serves to diffuse the ions, earlier implanted into the silicide layer 24, out from this layer and into the underlying silicon. In the same heating process, the titanium metal layer 22 is also converted to titanium silicide and merges with the original silicide layer 24. The oxide layer 26 will serve to prevent the oxidation of the silicide covered by it. However, the exposed silicide edge aligned with the edg of the patterned CVD oxide layer at openings 29 will be oxidized thereby extending the edge of the gate oxide layer under the CVD oxide layer as shown in FIG. 5 where the gate oxide layer 32 tucks under the CVD oxide layer 26 at regions 30. In this figure, the original titanium layer 22 is shown merged into the silicide layer 24. Also seen are the p+ type source/drain regions 34 formed in the n-well 12 by diffusion of the earlier implanted acceptor ions and the n+ type source/drain regions 36 formed by diffusion of the earlier implanted donor ions. Portions of the silicide layer 24 serve to provide the self-aligned source/drain electrodes for these regions.

Each channel edge will have an impurity profile of increasing concentration with distance away from the edge that serves to suppress hot carrier effects. Additionally, because the source and drain electrodes fix the locations of the source and drain regions, they can be positioned very close to the channel edges, thereby reducing the source and drain resistances advantageously.

The oxide extensions 30 serve as side-wall spacers. The width of these regions is proportional to the thickness of the gate oxide region, since they all were formed at the same time and this width can vary between 1.5 and 2 times the gate oxide thickness, depending on the oxidation conditions, because of the generally faster rate of oxidation of the titanium silicide as compared to that of monocrystalline silicon. If even thicker wall spacers are desired, as for example for high voltage gate devices, the oxidation time can be extended to increase the extent of oxidation, and the gate oxide can thereafter be etched anisotropically to reduce its thickness selectively to the value desired. Accordingly, a wide range of oxide wall spacer thickness is feasible. Because these side wall spacers are formed after the silicided source and drain electrodes, there is avoided any possibility of silicide growth along the side wall spacers.

Next there is blanket deposited in the usual fashion, preferably by a low temperature process, such as use of a radio frequency plasma, a layer of polycrystalline silicon over the wafer. Then this is patterned photolithographically in conventional fashion to form the gate electrodes 38 also shown in FIG. 5. As shown, the gate electrode 38 will be isolated from the silicided source/drain electrodes by the side wall spacers 30. The gate electrode 38 can be doped to a desired high conductivity in any known fashion, including ion implantation or doped in-situ during deposition.

Figure 6:
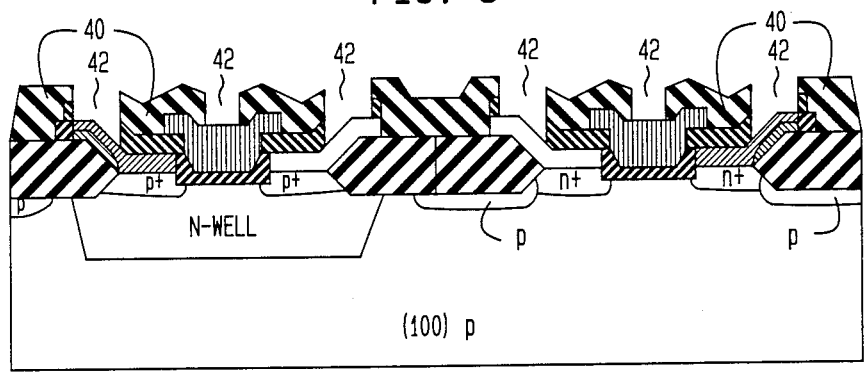

The resulting structure may be made ready for circuit use in any known fashion. Typically, there will be blanket deposited a phosphorous-doped glass which is then patterned to provide openings by way of which contact terminals may be provided to the source, drain and gate regions. In FIG. 6 the deposited glass layer 40 is shown already patterned to provide the openings 42 to the underlying source, drain and gate electrodes.

Figure 7:
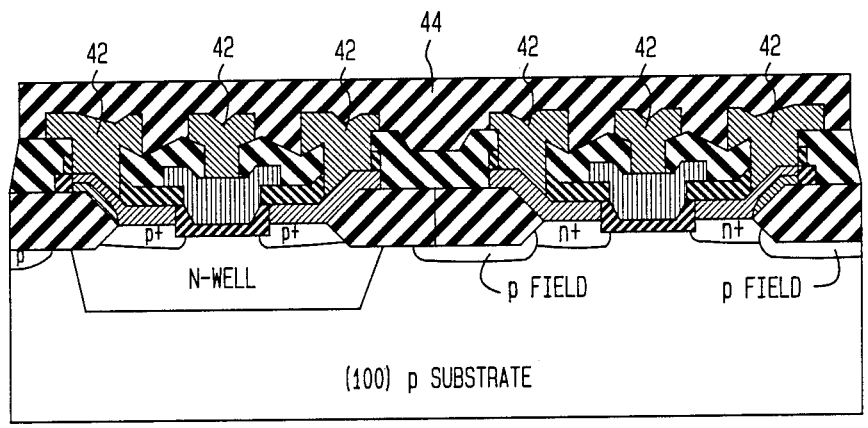

Finally, there is blanket deposited, typically by evaporation, the contact metal, usually aluminum, which makes contact to the source, drain and gate electrodes, by way of the openings provided in the glass layer 40, and this aluminum layer is then patterned, as desired, to isolate the various contact terminals. In FIG. 7, the aluminum layer is shown filling the openings 42. It is also usual to deposit a passivating layer 44, usually either a glass or a nitride, over the surface.

It is to be understood that various modifications may be made in the basic process described. For example, the wafer may be initially n-type in which p-wells are formed or there may be used a dual-well structure including both p- and n-type wells in a high resistivity substrate.

Additionally, other refractory metals may be substituted for the titanium, such as tungsten or tantalum which can form a highly conductive silicide for use as the source and drain electrodes as well as a highly resistive oxide for use as the side-wall spacers.

Moreover, it can be appreciated that there may be deposited initially only a silicide of the metal rather than the metal followed by the silicide. Alternatively, in some instances, it may be preferred to deposit simply the refractory metal for conversion to its silicide, the latter usually being better adapted for use as electrode material. It will be convenient to use the expression silicidable refractory layer to denote generally a layer which consists of either the refractory metal, its silicide, or both.

Additionally the various dimensions mentioned are to be understood as being exemplary with other dimensions being feasible depending on the operating parameters desired.

Similarly, substitutions can be made for the various dopants and masking materials mentioned. It is to be understood that although in the illustrative embodiment only single transistors were included in each of the p-type and n-type initial regions, groups of transistors of the same conductivity type can be included in each of these regions. Additionally, it should be apparent that while the description has focused on forming CMOS devices, the anticipated primary use of the invention, the basic principles are applicable to the formation of either p-type devices or n-type devices alone.

The embodiments of the invention in which an exclusive property or privilege is claimed are defined as follows:

1. A process for making CMOS devices comprising the steps of:
   preparing a wafer which includes at its front surface p-type silicon and n-type silicon regions spaced apart by field-oxide regions;
   depositing over the front surface a first refractory silicidable layer;
   implanting donor ions and acceptor ions selectively into the portions of the first layer overlying p-type regions and n-type regions, respectively;
   depositing a masking layer over the first layer;
   patterning the masking layer and the first layer to leave corresponding openings in the masking layer and the first layer for exposing portions of the p-type regions and n-type regions to serve as channels of the CMOS device;
   heating the wafer in an oxidizing atmosphere to form a layer of gate oxide over the exposed portions of the n-type and p-type regions, to form oxide spacers along the side walls of the openings in the first layer, and to diffuse the implanted ions out of the first layer into the underlying portions of the n-type and p-type regions to form source/drain regions of the CMOS devices with the overlying portions of the first layer serving as source/drain electrodes to such regions;
   depositing a polycrystalline silicon layer over the front surface of the wafer; and
   patterning the polycrystalline silicon layer to form gate electrodes which overlie and contact the gate oxide layer but which are electrically isolated from first layer portions by the oxide spacers and by portions of the masking layer.

2. The process of claim 1 in which the refractory silicidable layer is a layer of material taken from the group comprising tantalum, titanium and tungsten and their silicides.

3. The process of claim 1 in which the masking layer is a layer of deposited silicon oxide.

4. The process of claim 1 in which the refractory silicidable layer comprises a layer of titanium silicide over a layer of titanium metal.

5. The process of claim 4 in which the spacer oxide is an oxide of silicon.

6. The process of claim 1 which further comprises the provision of conductive contacts to each of the source, drain and gate electrodes.

7. A process of forming a semiconductive device comprising the steps of:
   preparing a wafer which includes at its front surface a region of a first conductivity type;
   depositing over such region a first refractory silicidable layer;
   implanting ions characteristic of the opposite conductivity type into the first layer;
   depositing a masking layer over the first layer;
   patterning the masking layer and the first layer to form an opening therein for exposing a portion of the first region to serve as the channel of the device;
   heating the wafer in an oxidizing atmosphere to form a layer of oxide over the exposed portion of the first region, to form oxide spacers along the side walls of the opening and to diffuse the implanted ions out of the first layer into underlying portions of the first region for forming source and drain regions of the device with the overlying portions of the first layer serving as source and drain connections thereto;
   depositing a polysilicon layer over the front surface of the region of the wafer; and
   patterning the polysilicon layer to form a gate electrode which overlies the gate oxide but is electrically isolated from the portions of the first layer by the oxide spacers and by the masking layer.

8. The process of claim 7 in which the masking layer is a layer of deposited silicon oxide.

* * * * *